METHOD OF MAKING PRINTED CIRCUITS

Filed Jan. 2, 1963

INVENTORS
FREDERICK W. SCHNEBLE, JR.
RUDOLPH J. ZEBLISKY
BY
Morgan, Finnegan, Durham & Pine
ATTORNEYS 3,226,256

METHOD OF MAKING PRINTED CIRCUITS

Frederick W. Schneble, Jr., 29 Hill Drive, Oyster Bay, N.Y., and Rudolph J. Zeblisky, 41 Glenwood Drive, Hauppague, N.Y.

Filed Jan. 2, 1963, Ser. No. 249,063
9 Claims. (Cl. 117—212)

This application is a continuation-in-part of copending application Serial No. 785,703, filed Jan. 8, 1959, now abandoned.

The present invention relates to a novel and improved method of making printed circuits on insulating supports.

Objects and advantages of the invention will be set forth in part hereinafter and in part will be obvious herefrom, or may be learned by practice with the invention, the same being realized and attained by means of the instrumentalities and combinations pointed out in the appended claims.

The invention consists in the novel parts, constructions, arrangements, combinations and improvements herein shown and described.

The accompanying drawings, referred to herein and constituting a part hereof, illustrate one embodiment of the invention and together with the description, serve to explain the principles of the invention.

Figure 1:
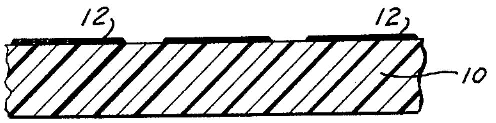

As shown in FIGURE 1, the insulating base member 10, formed of a suitable stable insulating sheet material is screen printed with ink 12 containing the receptive agent to form the active sites adherent on the base 10.

Figure 2:
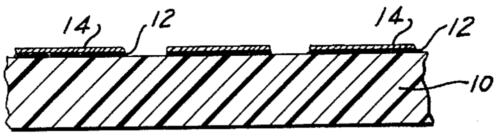

Thereafter, the insulating base 10 with the imprinted active sites 12 is immersed in an electroless plating bath and the ink areas 12 containing active sites only become adherently coated with a thin film 14, from about 0.0001 to 0.001 inch in thickness with the electroless-deposited copper, nickel or other metal, as shown in FIGURE 2.

Figure 3:
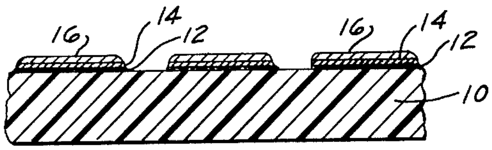

Thus prepared, the sheets may be provided with additional metal to form areas of better mechanical properties, which at the same time have better electrical conductivity. As shown in FIGURE 3, the imprinted areas 12 provided with a thin electroless deposit of metal 14 have been dip-soldered with the solder 16 adhering only to those areas 12 which formed the original ink impression.

Figure 4:
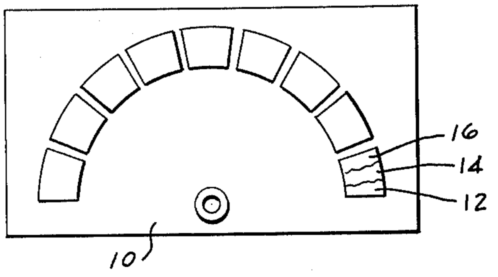

FIGURE 4 shows a schematic plan view of a simple printed circuit produced by the present invention and in which the base 10 is provided with switching segments 16 each of which may be considered as corresponding in detail to the sectioned parts 12, 14 and 16 of FIGURES 1 to 3.

An object of the present invention is the provision of an extremely simple, economical and rapid method of forming a printed circuit on a wide variety of insulating base members. A further object is the provision of a process of forming printed circuits which avoids the use of foil-coated insulating base members, and also simplifies the treatment of the base so that a metallic circuit may be formed on the base, often without the use of electrodeposition to form the metallic conducting elements of the circuit.

In accordance with the process of the present invention, a sheet or surface of the desired insulating base material is provided with selected adherent, imprinted areas of a material which provides active centers for electroless deposition of metal arranged according to the pattern of the circuit desired to be formed on the insulating base member. This pattern of material receptive to electroless deposition may be provided on the base by screen printing with an adhesive ink containing or provided with the receptive material, or by other techniques known to the art or described herein.

As used herein, the terms "printing" and "ink" mean, respectively, the deposition of a material in selected areas on a base member as by screen-printing or relief printing, and a base composition or medium in which is carried a receptive agent.

Heretofore, it has been suggested to manufacture printed circuits by printing on an insulating backing a design of the circuit by means of various inks containing receptive particles and then electrolessly depositing a conductive material on the receptive particles.

One of the problems that has been encountered in such a procedure concerns the adhesion between the receptive particles and the base. Techniques previously described include seeding a base material with aqueous acidic solutions of precious metal ions such as palladium chloride. For example, the insulating material may be immersed in a bath comprising an aqueous acidic solution of stannous chloride and palladium chloride to render selected areas of the insulating material sensitive to the reception of an electroless metal deposit. Such sensitization baths, however, have many disadvantages. First and foremost, the adhesion between the precious metal deposit and the subsequently electrolessly deposited metal has been found to be tenuous. As a result, when the resulting circuits are subjected to rugged mechanical handling, or heat shock, such as by dip soldering, there is a tendency for the conductive layer to crack or pop free of the base, thereby disrupting the circuit. Additionally, such treating solutions are ponderous and expensive to employ, and must be carefully regulated if good results are to be achieved.

This and other problems of the prior art are overcome by the present invention.

According to this invention, a process for metallizing insulating surfaces has been discovered which comprises providing an insulating base material with adhesively bound, finely divided, solid particles of an agent catalytic to the reception of electroless deposited metal, and then subjecting the resulting base material to an electroless metal bath.

The catalytic compositions or inks of the present invention comprise dispersions of an adhesive resin base and finely divided particles of an agent which is receptive to electrolessly deposited metal.

The receptive agents dispersed throughout the resin base are cheap, readily available, solid, particulate, finely divided metal or metal oxides, including titanium, aluminum, copper, iron, cobalt, zinc, titanous oxide, copper oxide, and mixtures of the foregoing.

Particularly good results are achieved when the receptive agent is cuprous oxide and this material is preferred for use. Cuprous oxide is itself an exceptionally good insulator of electricity. Additionally, when reduced, as by treatment with an acid, the cuprous oxide may be changed to metallic copper to initially form the conducting portion of the desired printed circuit design which may then be further built up by electroless deposition by immersion or otherwise treating with an electroless metal depositing bath.

The catalytic compositions or inks of the present invention may take a variety of forms.

For example, the insulating base members contemplated for use are most frequently formed of resinous material. When this is the case, the active agent disclosed herein, and especially copper oxide, in finely divided form, may be incorporated into the resin by milling, calendering, or other conventional methods after which the resin is set to form the base.

Alternatively, a thin film or strip of unpolymerized resin having particles of the active agent suspended therein might be laminated to a resinous insulated base and cured thereon. In this embodiment, the insulating base could be a resin impregnated laminate of paper or cloth sheets or Fiberglas.

In the preferred embodiment an ink comprising an adhesive resinous material having dispersed therein finely divided particels of the catalytic agent is printed on the surface of an insulating support and cured thereon.

Regardless of the manner in which it is incorporated in or on the base material, the catalytic agent is present in a finely divided form and preferably passes 200 mesh, U.S. Standard Sieve Series. Ordinarily from a small fraction of 1% to about 80% by weight of the active agent is admixed with adhesive resinous material to form the catalytic composition, but this concentration will depend to a large extent upon the materials used, and upon the time in which the catalytic compositions are allowed to remain in the electroless plating bath.

The resins into which the particles of the active material are dispersed preferably comprise, in combination, a thermosetting resin and a flexible adhesive resin. Typical of the thermosetting resins may be mentioned oil soluble phenolic type resins, such as fusible copolymers of phenol, resorcinol, a cresol, or a xylenol with an aldehyde or with furfural. Also may be mentioned the polyester resins, which are well known in the chemical art and are prepared by reacting dicarboxylic compounds with dihydric alcohols, for example, by the reaction of phthalic or maleic anhydride with mono-, di-, or polyethylene glycols. The polyester resins are ordinarily dissolved in styrene monomer and cross-linked by reaction with the styrene. As the thermosetting resin may also be mentioned epoxy resins, such as the reaction product of epichlorohydrin with bisphenol A. Typical of the flexible adhesive resins are the epoxy resins, polyvinyl acetal resins, polyvinyl alcohol, polyvinyl acetate, and the like. Also as the adhesive resin may be mentioned chlorinated rubber and butadiene acrylonitrile copolymers.

The adhesive resins of the type described have appended thereto polar groups, such as nitrile, epoxide, acetal, and hydroxyl groups. Such adhesive resins copolymerize with and plasticize the thermosetting resins, and impart good adhesive characteristics through the action of the polar groups.

The thermosetting resin portion of the composition is required in order to afford resistance to heat upon soldering, and also to protect against decomposition when subjected to the electroless metal bath. A thermosetting resin along, however, will not ordinarily have adequate tackiness or sufficient flexibility to resist heat shock; and would have negligent resistance to peeling of long conductor patterns from the surface. Admixture of adhesive resins such as those disclosed overcome the deficiencies of the thermosetting resins, and together, the thermosetting and adhesive resins provide an especially suitable composition for carrying the catalytic agents and for adhesively binding them to the base.

Particularly suitable for use as the adhesive resin for certain substrates is a combination of a phenolic type resin and an epoxy resin. The most common epoxy resins for use in the resinous composition are copolymers of epichlorohydrin (1-chloro-2,3-epoxy propane) with bisphenol A (2,2-p-hydroxy phenyl propane). Such copolymers have melting points within the raneg of 20° F. to 375° F. and molecular weights of about 350 to 15,000.

Although epichlorohydrin is the most important organic epoxide employed in the formation of the epoxy resins, other epoxides such as, for example, 1,2,3,4-diepoxy butane may be used. Similarly, epoxy resins derived from phenols other than bisphenol A are suitable for use. Such resins include, for example, the reaction product of epichlorohydrin with resorcinol, with phenols derived from cashew nut oils, with hydroquinone, with 1,5-dihydroxy naphthalene or with 2,2,5,5-tetra bis-(4-hydroxy phenyl) hexane. Phenolic intermediates of the resol type hydrazines and sulfonamides, such as, for example, 2,4-toluene disulfonamide, may also be used for reaction with an organic epoxide to produce epoxy resins suitable for use. Aliphatic epoxy resins are also suitable. Such resins are, for example, the reaction product of epichlorohydrin with glycerol, with ethylene glycol or with pentaerythritol.

The phenolic type resin may be a copolymer of a phenol, resorcinol, a cresol or a xylenol with an aldehyde or with furfural. Thus, it may be a copolymer of phenol or a substituted phenol with formaldehyde or a formaldehyde-yielding material, such as, paraformaldehyde or hexamethylene tetra-amine. The phenolic resin is preferably of the oil soluble type. As examples of thermosetting phenolic type resins which may be used may be mentioned copolymers of formaldehyde with p-cresol, p-ethyl phenol p-tert butyl phenol, p-tert amyl phenol, p-tert octyl phenol, p-phenyl phenol, di-isobutyl phenol, or a "bisphenol," such as 4,4-isopropylidene diphenol or 2,2-bis(p-hydroxy phenyl) propane. It may be of the modified type, such as, for example, one which has been modified with copal or rosin to cause it to be oil soluble.

The phenolic type resins are, themselves, curing agents for the epoxy resins, and even those which are themselves permanently fusible form a tough, adherent film in combination with an epoxy resin which is probably the result of a cross-linking between the epoxy resin and the phenolic type resin. However, the resinous compositions may contain an additional curing agent. This curing agent may be another resin, such as, for example, a polyamide resin or a melamine-formaldehyde resin, or it may be for example, a dibasic acid, such as, for example, phthalic anhydride, an amine, such as, for example, triethanolamine, diethylene triamine or metaphenylene diamine, or an amide, such as, for example, dicyandiamide.

When using a thermosetting type of phenolic resin, a curing agent for the phenolic, such as, for example, one of the amines mentioned hereinabove as a curing agent for epoxy resin may be employed.

The active catalytic agent, it should be clear, is incorporated into the resinous compositions in such a way that the agent is dispersed throughout the resin, and present in the resin, upon curing at numerous individual sites. The type of catalytic particles that will be used will depend upon the particular techniques to be employed in forming the printed circuit. When using the so-called reverse method, care should be used to employ non-conducting catalytic agents, such as copper oxide. In this method, the catalytic composition would be adhered to the over-all surface of the base material or the base material would itself constitute the catalytic composition, and selected portions thereof would then be masked, leaving exposed the conductor pattern. The base would then be immersed in the electroless metal bath to deposit electroless metal on the exposed areas. Were the catalytic composition employed conductive, leakage would occur between the lines of the conductor pattern through the catalytic composition. Obviously, such a situation could not be tolerated.

When large amounts of the active agent are employed, as compared to the resin, relatively small amounts of resin bind the uppermost or surface particles of the active agent. Accordingly, electroless metal can readily deposit on the active agent on the surface. When small amounts of the active agent are employed in comparison to the resin, e.g., 0.25 to 10% by weight, it may be that the active agent at the surface of the catalytic composition will be completely coated by the resinous material. In this situation, it may be necessary to abrade the surface so that the particles will be exposed to the electroless plating bath. If, in this situation no abrasion is used, it will be necessary to expose the surface to the electroless plating bath for several hours before the initial metal deposit will form.

When copper oxide is used, it is preferable to activate the cuprous oxide by treatment with an acid, to convert at least a portion of the cuprous oxide particles at the surface of the ink to copper. Preferred for use is sulfuric acid. Other reducing agents which are acceptable include aqueous solutions of phosphoric acid, acetic acid, sulfuric acid, hydrofluoric acid, dithionates, hypophosphites, and the like. Nitric acid may also be used but it is not quite as desirable as the others since it dissolves the copper formed at a rather high rate. Alkaline formaldehyde solutions including the electroless copper baths disclosed herein will also reduce the cuprous oxide.

Further according to the present invention the ink containing the receptive agent may be deposited only on those areas of a base member which are to form the conductive portions of the printed circuit member. This is the so-called positive method of forming printed circuits.

In this method, after the printed impression containing active centers for electroless deposition has been formed on the base member, the entire base is immersed in an electroless bath, causing metal to be deposited only on those areas which contain receptive agent, whereby the surface is provided with precisely defined, highly conductive areas on a base material having good insulating properties. When employing this technique, it is obvious that any of the catalytic agents described hereinabove may be employed.

Once the initial conductive metal deposits have been formed, regardless of how formed, they may be variously treated. A primary treatment is usually to heat the base member and its adherent deposits, so as to set the adhesive portion of the ink, thereby effectively and permanently securing the metallic deposit to the base member. After this preliminary treatment, other steps may be taken to provide the electrically conductive areas with a thicker deposit of metal. The metallic areas may be built up by electrodeposition of the desired metal, or, if the base material and electroless-deposited metal are suitable, the entire piece may be dip-soldered by being dipped into a molten solder bath so that the metallized areas only, on the base material are provided with a solder coating, which not only forms the electrically conducting circuit components, but also provides for the easy soldering of the circuit components to other circuit elements.

A variety of metals may be deposited on the areas containing receptive agent on the base member by electroless deposition, such as copper, nickel, silver and rhodium, and any desired metal may be deposited on the electroless metal deposit. Likewise, a variety of metallic deposits or alloys may be added to the electroless deposit by immersion of the base member in a molten bath of a metal or alloy which will adhere to and thereby bond with the electroless deposited metal, and which will not bond to the remainder of the surface of the insulating base member. Alternatively, various metals may be electrodeposited on the metal which has already been deposited electrolessly.

The base materials must be those which will withstand the temperatures which will be encountered in processing and in use, but in most instances the base material will be a sheet of ceramic, a phenol-formaldehyde resinous sheet material, a melamine-urea resin, vinyl acetate-chloride copolymer, cellulose acetate, rubber, epoxy resin polymers, glass cloth, epoxy coated glass, or other stable, solid insulating materials. Of course, the ink must have a base medium which is adherent on the insulating base material, and which will withstand the processing conditions, as well as the conditions encountered in use.

As illustrative of the method of the present invention, the following specific and preferred example is given:

A base member comprising a sheet of phenol-formaldehyde resin impregnated, smooth-surfaced sheet material, having good insulating properties, is subjected to a screen printing operation by which its surface is provided with an impression formed by an ink comprising the adhesive base medium and a receptive material.

The ink may be composed of a phenolic resin-modified acrylonitrile-butadiene copolymer composition, suitably diluted with plasticizers and solvents to render it capable of use as a printing ink in the screen stenciling process or as an ink for inking a relief printing plate. The ink also includes from about 1 to 10% of the desired receptive agent which may be aluminum powder or other suitable agent to cause the deposition of metal onto the imprinted areas from an electroless plating bath.

A preferred composition for the catalytic ink is as follows:

*Example 1*

| | grams |
|---|---|
| Phenol-formaldehyde resin (alcohol soluble) | 60 |
| Polyvinyl butyral resin | 40 |
| Ethanol | 100 |
| Cuprous oxide (powdered) | 20 |
| Powdered silica / Diethyl carbonate | Sufficient to adjust the viscosity to approximately 200 poises at 20° C. |

Other ink formulations suitable for use in the present process are as follows:

*Example 2*

| | grams |
|---|---|
| Phenol-formaldehyde resin (alcohol soluble) | 60 |
| Polyvinyl butyral resin | 40 |
| Ethanol | 100 |
| Zinc dust | 3 |
| Powdered silica / Diethyl carbonate | Sufficient to adjust the viscosity to approximately 200 poises at 20° C. |

The resins are dissolved in 100 grams of ethanol and 100 grams of diethyl carbonate. This resin solution, along with the dry materials is best mixed on a three roll paint mill.

*Example 3*

| | grams |
|---|---|
| Phenol-aldehyde resin-epoxy resin | 100 |
| Hexamethylene tetramine | 3 |
| Butadiene acrylonitrile copolymer | 100 |
| Aluminum powder | 6 |
| Diethyl carbonate / Diacetone alcohol | Sufficient to make solution with viscosity of 200 poises at 20° C. |

Other examples of catalytic inks especially suitable for use in practicing the invention are given below:

*Example 4*

| | grams |
|---|---|
| Xylene | 50 |
| Diacetone alcohol | 75 |
| Parlon 10 cps. | 50 |
| Phenol-formaldehyde (oil soluble) | 10 |
| Butadiene-acrylonitrile rubber | 20 |
| Cab-O-Sil | 3 |
| Cuprous oxide | 70 |

*Example 5*

| | grams |
|---|---|
| Butadiene-acrylonitrile rubber | 15.5 |
| Diacetone alcohol | 72 |
| Nitromethane | 72 |
| Phenol-formaldehyde resin (oil soluble) | 7.5 |
| Cab-O-Sil | 4 |
| Ethanol | 3 |
| Parlon 10 cps. | 10 |
| Xylene | 50 |
| Cuprous oxide | 80 |

*Example 6*

| | grams |
|---|---|
| Butadiene-acrylonitrile rubber | 15.5 |
| Diacetone alcohol | 50 |
| Nitromethane | 50 |
| Phenol-formaldehyde resin (oil soluble) | 7.5 |
| Parlon 10 cps. | 3 |
| Toluene | 20 |
| Cab-O-Sil | 3 |
| Ethanol | 3 |
| Cuprous oxide | 60 |

*Example 7*

| | grams |
|---|---|
| Butadiene-acrylonitrile rubber | 15.5 |
| Diacetone alcohol | 50 |
| Nitromethane | 50 |
| Phenol-formaldehyde resin (oil soluble) | 7.5 |
| Cab-O-Sil | 3 |
| Ethanol | 3 |
| Cuprous oxide | 60 |

*Example 8*

| | grams |
|---|---|
| Toluene | 50 |
| Diacetone alcohol | 50 |
| Butadiene-acrylonitrile rubber | 10.5 |
| Phenol-formaldehyde resin (oil soluble) | 7.5 |
| Parlon 10 cps. | 5 |
| Ethanol | 5 |
| Cab-O-Sil | 6 |
| Cuprous oxide | 50 |

*Example 9*

| | grams |
|---|---|
| Epoxy resin | 15 |
| Butadiene-acrylonitrile rubber | 15 |
| Diacetone alcohol | 50 |
| Toluene | 50 |
| Phenol-formaldehyde resin (oil soluble) | 11 |
| Cuprous oxide | 60 |

In Examples 4, 5, 6 and 8, Parlon is a chlorinated rubber from Hercules Powder Company. The epoxy resin of Example 9 is DER 332, sold by Dow Chemical Company, and is the reaction product of epichlorohydrin and bisphenol A. It has an epoxy equivalent of 173 to 179, an average molecular weight of 340 to 350 and a viscosity at 25° C. of 3600 to 6400. Cab-O-Sil is a tradename for silica aerogel.

To prepare the coating compositions or inks disclosed in Examples 1 to 9, the resins are dissolved in the solvents and milled with the pigments on a three roll mill.

The viscosity of compositions having the formulae of Examples 4 to 9 will ordinarily vary between about 5 and 100 poises at 20° C.

As already indicated, the catalytic inks may be applied to the panel in any convenient manner. For example, when a direct process for making printed circuits is employed, the circuit pattern of the ink may be imposed on the insulating base by screen printing or offset printing techniques. When the reverse process is employed, the insulating base may be coated with the catalytic ink, as by dipping, spraying, calendering, and the like, and then portions thereof masked to leave exposed the conductor pattern. When the catalytic inks are used to produce plated through holes, the ink may be drawn into the holes by vacuum. Alternatively, the pierced panels may be dipped into the inks, and then vibrated to remove excess ink from the holes.

After treatment of the panel with the catalytic ink, the adhesive base of the ink may be partially or fully cured by heating, thereby firmly bonding the adhesive ink with its contained receptive agent to the insulating base member. Preferably, the adhesive resin is partially cured after application and fully cured by heating following treatment with the electroless metal bath.

The insulating base materials used to make the printed circuits must be able to withstand the temperatures which will be encountered in processing and in use. Preferable for use as insulating base materials are sheets of ceramic, phenol-formaldehyde, melamine-urea, vinyl acetate-chloride copolymer, rubber, epoxy resin polymers, epoxy impregnated Fiberglas, and the like.

After curing, the catalytic ink may be lightly abraded by rubbing its surface with steel wool, sand paper or other abrasive material so that the receptive particles which make up the active sites are exposed. As indicated hereinabove, this step is not always necessary and depends to a large extent upon the exact nature of the adhesive composition employed in the ink and upon the concentration of the receptive particles in the ink.

When thus prepared, the imprinted base material is immersed in an electroless plating bath adapted to deposit the desired metal upon the imprinted areas containing active sites on the base. Conventional electroless plating baths for the deposition of copper, nickel, silver or other metals may be employed, and suitable electroless plating baths for the deposition of copper are disclosed in Wein, "Copper Films," U.S. Department of Commerce PB 111237, and elsewhere. When electroless copper is desired, the following bath, which is relatively stable, forms excellent bright deposits of electroless copper deposits of substantial theickness:

| | Grams |
|---|---|
| Copper sulfate crystals | 14.6 |
| Sodium hydroxide | 7.5 |
| Rochelle salts | 7.5 |
| Formaldehyde (37%) | 34 |
| Water, sufficient to make 1000 ml. | |

The receptive imprinted object to be formed into the printed circuit is immersed in this bath at room temperature for a period of one to several hours, depending upon the thickness of copper deposit required, after which it is removed and thoroughly washed with water.

Thereafter, the copper which has been deposited only on those portions bearing the exposed receptive agent ink impression and the overlying copper deposit, may be subjected to electroplating in any conventional electroplating bath to increase the thickness of the copper deposit, or may be plated with a layer of silver or whatever other metal is required to give the desired conductivity. Alternatively, the insulating base member with its impression and electroless deposited layer of copper may be immersed in a bath of molten solder and promptly withdrawn, the solder adhering only to those portions of the base member which have been provided with a copper deposit on the surface of the base member, and this solder layer will ordinarily be of sufficient thickness so that it will allow other soldered connections to be made to its several portions.

Instead of immersing the receptive imprinted base member in a copper plating bath, it may be immersed in a nickel plating bath, such as that disclosed in Brenner, "Electroless Plating Comes of Age," Metal Finishing, December 1954, in which case the electroless deposit may be followed by a further electroplating operation, by dip-soldering, or such other operations as are desired.

The invention in its broader aspects is not limited to the specific mechanisms shown and described but departures may be made therefrom within the scope of the accompanying claims without departing from the principles of the invention and without sacrificing its chief advantages.

What is claimed:

1. A process for forming printed circuits which comprises providing an insulating base having surface portions consisting essentially of an adhesive resinous bonding composition having dispersed therein at numerous individual sites solid, finely divided, discrete particles of a catalytic agent selected from the group consisting of titanium, aluminum, copper, iron, cobalt, zinc, titanium oxide, copper oxide and mixtures of the foregoing, said resinous bonding composition further comprising, in combination, a thermosetting resin and a flexible adhesive resin, the flexible adhesive resin having appended thereto a polar group which is a member selected from the group consisting of nitrile, epoxide, acetal, chloride and hydroxyl groups, curing the adhesive resinous bonding composition to firmly adhere the finely divided particles of said member to the base, while retaining the discreteness of the particles and their presence at numerous individual sites, and treating the resulting base with an electroless metal deposition bath to adherently deposit electroless metal directly on the cured adhesive resinous bonding composition so as to form a conducting pattern.

2. The process of claim 1 wherein the thermosetting resin is a member selected from the group consisting of oil soluble phenolic type resins, polyester resins thermosetting epoxy resins, and mixtures of the foregoing, and wherein the flexible adhesive resin is a member selected from the group consisting of flexible epoxy resins, polyvinyl acetal resins, polyvinyl alcohol, polyvinyl acetate, chlorinated rubber, and butadiene acrylonitrile copolymers and mixtures of the foregoing.

3. The process of claim 1 wherein the adhesive resinous bonding composition comprises from about 0.25 to 80% by weight of the catalytic particles.

4. The method of claim 1 wherein the electroless metal deposition bath is an alkaline copper electroless deposition bath comprising water, a copper salt, an alkali metal hydroxide, a complexing agent for the copper salt, and formaldehyde.

5. The method of claim 1 wherein the adhesive resinous bonding agent is partially cured prior to treatment with the electroless metal bath and fully cured after said treatment.

6. A process for forming printed circuits which comprises providing an insulating base having surface portions consisting essentially of an adhesive resinous bonding composition having dispersed therein at numerous individual sites solid, finely divided, discrete particles of an agent which is catalytic to the reception of electroless copper and capable of catalyzing metal deposition from an electroless copper depositing bath, the amount of said particles being between about 0.25 and 80% of the combined weight of particles and adhesive resinous bonding agent, said adhesive resinous bonding composition comprising, in combination, a thermosetting resin which is a member selected from the group consisting of oil soluble phenolic type resins, polyester resins, thermosetting epoxy resins, and mixtures of the foregoing and a flexible adhesive resin which is a member selected from the group consisting of flexible epoxy resins, polyvinyl acetal resins, polyvinyl alcohol, polyvinyl acetate, chlorinated rubber and butadiene acrylonitrile copolymers, including mixtures of the foregoing, curing the adhesive resinous bonding composition to firmly adhere the finely divided solid particles to the base, while retaining the discreteness of the particles and their presence at numerous individual sites, and treating the resulting base with an electroless copper solution to adherently deposit electroless copper on the cured adhesive resinous bonding composition so as to form a conducting pattern.

7. The process of claim 6 wherein the electroless copper bath is an alkaline copper electroless deposition bath comprising water, a copper salt, an alkali metal hydroxide, a complexing agent for the copper salt, and formaldehyde.

8. A process for metallizing an insulating base which comprises coating the base with an adhesive resinous bonding composition having dispersed therein at numerous individual sites solid, finely divided, discrete particles of an agent which is catalytic to the reception of electroless copper and capable of catalyzing metal deposition from an electroless copper depositing bath, the amount of said particles being between about 0.25 and 80% of the combined weight of particles and adhesive resinous bonding agent, said adhesive resinous bonding composition comprising, in combination, a thermosetting resin which is a member selected from the group consisting of oil soluble phenolic type resins, polyester resins, thermosetting epoxy resins, and mixtures of the foregoing and a flexible adhesive resin which is a member selected from the group consisting of flexible epoxy resins, polyvinyl acetal resins, polyvinyl alcohol, polyvinyl acetate, chlorinated rubber and butadiene acrylonitrile copolymers, and mixtures of the foregoing, curing the adhesive resinous bonding composition to firmly adhere the finely divided solid particles to the base, while retaining the discreteness of the particles and their presence at numerous individual sites, and treating the resulting base with an electroless copper solution to adherently deposit electroless copper on the cured adhesive resinous bonding composition.

9. The process of claim 8 wherein the electroless copper bath is an alkaline electroless copper deposition solution comprising water, a water soluble copper salt, a complexing agent for the copper salt, and a reducing agent.

References Cited by the Examiner

UNITED STATES PATENTS

| | | | |
|---|---|---|---|
| 2,191,581 | 2/1940 | Nowak et al. | |
| 2,441,960 | 5/1948 | Eisler | 41—43 |
| 2,683,673 | 7/1954 | Silversher | 117—212 X |
| 2,684,350 | 7/1954 | Williams. | |
| 2,703,252 | 2/1955 | Suchoff | 117—212 |
| 2,739,881 | 3/1956 | Kepple | 117—212 X |
| 2,748,023 | 5/1956 | Meth | 117—71 X |
| 2,757,104 | 7/1956 | Howes | 117—71 X |
| 2,759,845 | 8/1956 | Hilemn | 117—71 |
| 2,774,687 | 12/1956 | Nottebohm et al. | 117—161 X |
| 2,848,359 | 8/1958 | Talmey | 117—217 X |
| 2,851,380 | 9/1958 | Berlinghof | 117—212 |
| 2,910,351 | 10/1959 | Szpak et al. | 117—17.5 X |
| 3,031,344 | 4/1962 | Sher et al. | 117—212 |
| 3,086,888 | 4/1963 | Stratton et al. | 117—161 X |

OTHER REFERENCES

Wein: "The Formation of Copper Films on Non-Conductors—A Survey," Metal Finishing, August 1948, pp. 58–60.

WILLIAM D. MARTIN, *Primary Examiner.*